United States Patent
Kasperkovitz

(10) Patent No.: US 7,133,527 B2
(45) Date of Patent: Nov. 7, 2006

(54) STEREODECODER

(75) Inventor: Wolfdietrich Georg Kasperkovitz, Waalre (NL)

(73) Assignee: Semiconductor Ideas to Market B.V., AH Breda (NL)

( * ) Notice: Subject to any disclaimer, the term of this patent is extended or adjusted under 35 U.S.C. 154(b) by 522 days.

(21) Appl. No.: 10/486,599

(22) PCT Filed: Aug. 6, 2002

(86) PCT No.: PCT/EP02/08809

§ 371 (c)(1),
(2), (4) Date: Feb. 11, 2004

(87) PCT Pub. No.: WO03/017512

PCT Pub. Date: Feb. 27, 2003

(65) Prior Publication Data

US 2004/0208323 A1 Oct. 21, 2004

(30) Foreign Application Priority Data

Aug. 12, 2001 (EP) .................................. 01203048

(51) Int. Cl.
*H04H 5/00* (2006.01)
(52) U.S. Cl. ........................................ 381/2; 455/239.1
(58) Field of Classification Search ............... 381/1–7,
381/10–11, 14–16, 98; 455/239.1–250.1,
455/236.1
See application file for complete search history.

(56) References Cited

U.S. PATENT DOCUMENTS

| | | | | |
|---|---|---|---|---|
| 4,032,717 A | * | 6/1977 | Mallon | 179/15 |
| 4,221,928 A | * | 9/1980 | Franssen et al. | 381/11 |
| 5,257,312 A | * | 10/1993 | Therssen et al. | 381/4 |
| 5,440,586 A | * | 8/1995 | Den Braber | 375/327 |
| 6,226,504 B1 | * | 5/2001 | Takagi | 455/234.1 |

* cited by examiner

*Primary Examiner*—Vivian Chin
*Assistant Examiner*—Lun-See Lao
(74) *Attorney, Agent, or Firm*—Robert M. McDermott, Esq.

(57) ABSTRACT

An arrangement for decoding a stereo multiplex signal, comprising a baseband sum signal (L+R), a difference signal (L−R) which is amplitude-modulated on a suppressed sub-carrier and a pilot signal having a frequency located between the frequency bands of said sum and difference signals, said arrangement having an input for the stereo multiplex signal coupled through parallel stereo sum and difference signal paths to first and second inputs of a dematrix circuit, a synchronous demodulator being included in the difference signal path, a local sinusoidal sub-carrier being supplied to a carrier input of said synchronous demodulator for a synchronous demodulation of said amplitude-modulated difference signal (L−R) into baseband. To maximize stereo channel separation the arrangement is provided with an automatic gain control loop comprising a first mixer stage receiving a reference signal, a signal output thereof being coupled to a second mixer stage, both mixer stages having carrier inputs being supplied with said local sinusoidal sub-carrier for a respective up and down conversion of said reference signal, a signal output of said second mixer stage being coupled through a 6 dB attenuator to a difference circuit providing the difference between the output signal of the attenuator and the reference signal, said difference circuit being coupled to a control input of gain controlled amplifying means for varying the gain of said synchronous demodulator and said first and second mixer stages.

20 Claims, 2 Drawing Sheets

STEREODECODER

The invention relates to an arrangement for decoding a stereo multiplex signal, comprising a baseband sum signal (L+R), a difference signal (L−R) which is amplitude-modulated on a suppressed sub-carrier and a pilot signal having a frequency located between the frequency bands of said sum and difference signals, said arrangement having an input for the stereo multiplex signal coupled through parallel stereo sum and difference signal paths to first and second inputs of a dematrix circuit, a first mixer stage being included in the difference signal path, a local sinusoidal sub-carrier being supplied to a carrier input of said first mixer stage for a synchronous demodulation of said amplitude-modulated difference signal (L−R) into baseband. The invention also relates to an FM radio receiver comprising an arrangement for decoding a stereo multiplex signal.

Such arrangement is on itself known, e.g. from the article "The uA758, A Phase Locked Loop FM Stereo Multiplex Decoder" by L. Blaser et al, published in Application Note 319, June 1972, Fairchild Semiconductor Corporation.

A standard baseband stereo multiplex signal such as used in FM radio broadcast systems, comprises sum and difference signals of left and right stereophonic signals L and R, respectively, the sum signal (L+R) in its baseband frequency range located in a frequency range from 0 to 15 kHz, and the difference signal being double sideband AM-modulated on a suppressed sub-carrier of 38 kHz and covering a frequency range of 23 to 53 kHz The amplitude level of each of both sideband difference signals (L−R) and (R−L) corresponds to half of the amplitude level of the sum signal (L+R), this 1:2 ratio also being referred to as −6 dB difference. The stereo multiplex signal also comprises a 19 kHz stereo pilot signal which serves as a reference frequency during the regeneration of a local 38 kHz mixing carrier. At the receiver's end, the synchronous demodulation of the modulated difference signal (L−R) into baseband does not change this difference in amplitude level. The difference signal (L−R) needs to be 6 dB amplified, or amplified with a gain factor of two to arrive at the same amplitude level as the sum signal (L+R), which allows to properly dematrix these signals in the dematrix circuit into baseband stereo left and stereo right signals L and R, respectively.

The separation between the stereo left and stereo right signals L and R, hereinafter also being referred to as stereo channel separation, increases with the accuracy in level equality between the baseband sum signal (L+R) and the demodulated baseband difference signal (L−R). In practise, however, the first mixer stage provides synchronous demodulation by analogue mixing of the modulated difference signal (L−R) with said sinusoidal sub-carrier with a mixer gain, which is sensitive to parasitic effects, unwanted DC offsets and absolute and relative spread in the values of the circuit elements used. This limits the above accuracy in level equality between the above baseband sum and difference signals (L+R) and (L−R) and therewith also the maximum obtainable stereo channel separation of the analogue stereodecoders known sofas.

To reduce the influence of these sources of inaccuracy on the amplitude level of the difference signal (L−R), it is known e.g. from U.S. Pat. No. 4,658,123 to apply switched mode synchronous demodulation of the difference signal (L−R). Such switched mode operation, however introduces higher order harmonics of the local subcarrier frequency, which through non-linearities fold back into the frequency range of the useful stereosignals and/or substantially increases circuit complexity by the measures needed to reduce these higher order harmonics.

Now, therefore, it is an object of the invention to increase the stereo channel separation in analogue stereo decoders, while avoiding the above drawbacks from occurring This object is achieved in an arrangement for decoding a stereo multiplex signal as described in the opening paragraph according to the invention, which is characterized by an automatic gain control loop comprising a second mixer stage receiving a reference signal, a signal output thereof being coupled to a third mixer stage, both mixer stages having carrier inputs being supplied with said local sinusoidal subcarrier for a respective up and down conversion of said reference signal, a signal output of said third mixer stage being coupled through a 6 dB attenuator to a difference circuit providing the difference between the output signal of the attenuator and the reference signal, said difference circuit being coupled to a control input of gain controlled amplifying means for varying the gain of said first to third mixer stages.

The invention is based on the recognition that an indication of the parasitic effects, unwanted DC offsets and absolute and relative spread in the values of the circuit elements used can be derived from a dummy circuit using mixer circuits matched with the first mixer stage and simulating the modulation/demodulation process of the difference signal (L−R) from transmitter to receiver with a local reference signal.

By applying the invention, the second mixer stage provides an up conversion of the reference signal by double sideband suppressed carrier modulation on the frequency of the local subcarrier, whereas the third mixer stage provides down conversion of the reference signal to baseband. The so recovered reference signal is halved in amplitude level by the 6 dB attenuator, followed by a comparison with the original reference signal, the result thereof, i.e. the difference between the recovered, 6 dB attenuated reference signal on the one hand and the original reference signal on the other hand, being supplied as gain control signal to the control input of gain controlled amplifying means for varying the gain of said first to third mixer stages. In operation, the automatic gain control loop varies the gain of the second and third mixer stages such, that the amplitude of the recovered reference signal preceding the 6 dB attenuator is accurately stabilized at twice the amplitude of the original reference signal. This means, that the second and third mixer stages are accurately stabilized at 6 dB gain or put otherwise at a gain factor of two. Any deviation from this gain factor is automatically reduced by the automatic gain control loop. This secures an accurate control of the gain of the first mixer stage at a gain factor of two, resulting in a substantial increase in stereo channel separation compared with the above prior art analogue stereodecoders.

An embodiment of an arrangement according to the invention providing for a robust and a simple implementation is characterized in that said gain controlled amplifying means comprises a gain controlled sub-carrier amplifier for varying the amplitude of said local sinusoidal subcarrier prior to the supply thereof to the carrier inputs of said synchronous demodulator and said first and second mixer stages.

An embodiment of an arrangement according to the invention allowing for the use of a constant local sinusoidal sub-carrier is characterized in that said gain controlled amplifying means comprises first to third mutually corresponding gain controlled amplifiers, each having a control input in common with the control input of gain controlled amplifying means, said first gain controlled amplifier being included in the difference signal path, and said second and third gain controlled amplifier being included in the automatic gain control loop.

A further concept simplification is obtained in an arrangement according to the invention being characterized in that said reference signal is a DC level voltage.

An arrangement according to the invention providing an accurate 6 dB attenuation is characterized in that said 6 dB attenuator comprises a resistive voltage divider comprising two serially connect mutually equal resistors.

These and further aspects and advantages of the invention will be discussed more in detail hereinafter with reference to the disclosure of preferred embodiments, and in particular with reference to the appended Figures, wherein.

In the Figures, identical parts are provided with the same reference numbers.

Figure 1:
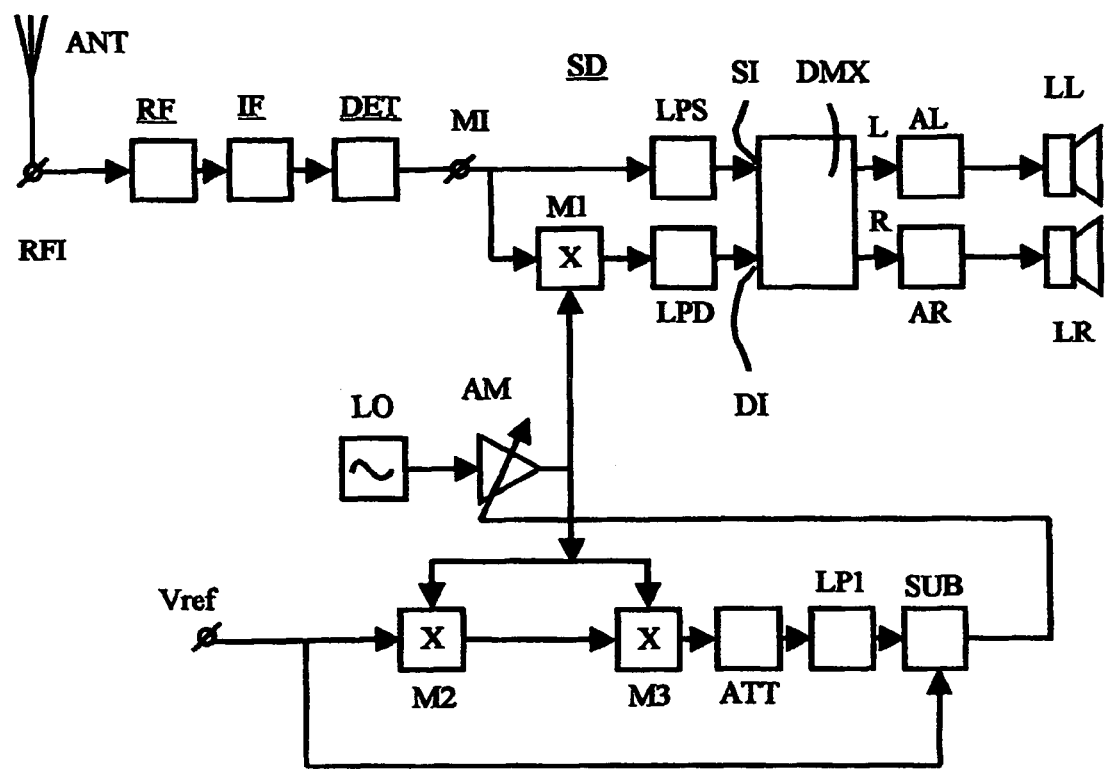
FIG. 1 shows an FM radio receiver comprising a first embodiment of an arrangement for decoding a stereo multiplex signal according to the invention.

FIG. 1 shows an FM stereo multiplex receiver having an RF input RFI to which an RF-FM reception signal is applied from an antenna ANT and which has successively coupled to said RF input RFI: an RF input amplifier and tuning section RF amplifying the RF-FM reception signal and converting it into an IF-FM signal an IF section IF selectively amplifying and limiting the IF-FM signal and an FM discriminator DET detecting the FM modulation signal of the IF-FM signal, which in the given case is a baseband stereo multiplex signal, and supplying the same to an input MI of an arrangement SD for decoding a stereo multiplex signal, hereinafter also being referred to as stereodecoder. The FM stereo multiplex receiver described sofar is on itself well know and need no further amplification for an understanding of the invention.

The stereo multiplex signal at the multiplex input MI of the stereo decoding arrangement SD comprises baseband sum and difference signals (L+R) and (L−R) of left and right stereophonic signals L and R, respectively, the sum signal (L+R) being located in a frequency range from 0 to 15 kHz, the difference signal (L−R) being double sideband AM-modulated on a suppressed sub-carrier of 38 kHz and covering a frequency range of 23 to 53 kHz. The amplitude level of the sideband difference signals (L−R) and (R−L) corresponds to half of the amplitude level of the sum signal (L+R), this 1:2 ratio also being referred to as −6 dB difference. The stereo multiplex signal also comprises a 19 kHz stereo pilot signal which serves as a reference frequency during the regeneration of a local 38 kHz mixing carrier. The multiplex input MI of the stereo decoding arrangement SD is coupled through parallel stereo sum and difference signal paths to first and second inputs SI and DI, respectively, of a dematrix circuit DMX. A low pass filter LPS is included in the sum signal path preceding the first input SI of the dematrix circuit DMX for selection of the baseband sum signal (L+R). A first mixer stage M1 is included in the difference signal path, a local sinusoidal 38 kHz sub-carrier being supplied from a local oscillator LO through gain controlled amplifying means AM to a carrier input of said first mixer stage M1 for a synchronous demodulation of said amplitude-modulated difference signal (L−R) into baseband difference signal L−R). The first mixer stage M1 is followed by a low pass filter LPD for a selection of the baseband difference signal (L−R) preceding the second input SD of the dematrix circuit DMX The dematrix circuit DMX dematrixes the baseband sum signal (L+R) and the baseband difference signal (L−R) into left and right stereo signals L and R which are applied via left and right audio signal amplifiers AL and AR to stereo left and right loudspeakers LL and LR, in which they are respectively amplified and reproduced.

According to the invention, the stereo decoding arrangement SD comprises an automatic gain control loop including said gain controlled amplifying means AM, supplying the local sinusoidal 38 kHz sub-carrier from the local oscillator LO to carrier inputs of second and third mixer stages M2 and M3, respectively. The second mixer stage M2 receives through a signal input, a reference signal Vref, a signal output thereof being coupled to a third mixer stage M3, said mixer stages M2 and M3 providing for a respective up and down conversion of said reference signal Vref. A signal output of said third mixer stage M3 providing the so recovered reference signal V'ref, is coupled subsequently through a 6 dB attenuator ATT and a low pass filter LP1 to a difference circuit SUB forming the difference between the 6 dB attenuated recovered reference signal V'ref, in short 0.5*V'ref, on the one hand and the original reference signal Vref on the other hand. This difference signal 0.5*V'ref−Vref is being coupled as an automatic gain control signal from the output of the difference circuit SUB to a control input of said gain controlled amplifying means AM for varying the amplitude of the local sinusoidal 38 kHz sub-carrier and therewith the mixer gain of said first to third mixer stages M1 to M3.

In an open loop situation and with the second and the third mixer stages M2 and M3 having unity gain, the amplitude level of the recovered reference signal V'ref at the output of the third mixer stage M3 is half of the amplitude level of the original reference signal Vref, i.e. V'ref=0.5*Vref due to the subsequent up-and downconversion in M2 and M3. A further attenuation in the 6 dB attenuator ATT results in likewise reduction of the amplitude level of V'ref by two, i.e. 0.25*Vref. In this open loop situation the automatic gain control signal at the output of said difference circuit SUB is −0.75*Vref. Closing the loop by supplying this automatic gain control signal to the control input of the gain controlled amplifying means AM effectuates an amplification of the local sinusoidal 38 kHz subcarrier such that the amplitude level of the recovered reference signal V'ref at the output of the third mixer stage M3 is twice the amplitude level of the original reference signal Vref. At this gain setting of M2 and M3, both input signals of the difference circuit SUB are equal to each other and the loop is stabilised. By supplying the so amplified local sinusoidal 38 kHz subcarrier simultaneously to the carrier input of the first mixer stage M1, the amplitude level of the baseband difference signal (L−R) at the output of M1 equals that of the sum signal (L+R).

According to the invention, any deviation from this ideal gain factor two, due to the above parasitic effects, unwanted DC offsets and absolute and relative spread in the values of the circuit elements used is being reduced by the operation of the automatic gain control loop. The stereo channel separation obtained with the arrangement for decoding a stereo multiplex signal according to the invention is therewith insensitive to such sources of inaccuracy and therewith providing a substantial increase in stereo channel separation compared with the above cited prior art analogue stereodecoders. The maximum obtainable accuracy in level equality between sum and difference signals (L+R) and (L−R) respectively, is substantially determined by the accuracy of the 6 dB attenuator. Such 6 dB attenuator can easily be implemented with high accuracy e.g. by using a resistive voltage divider comprising two serially connected mutually equal resistors defining a precize 1:2 ratio, or 6 dB attenuation, between output and input signal amplitude. The mutual spread in the resistance values of said resistors when being is monolithically integrated, can be kept small by matching.

Figure 2:
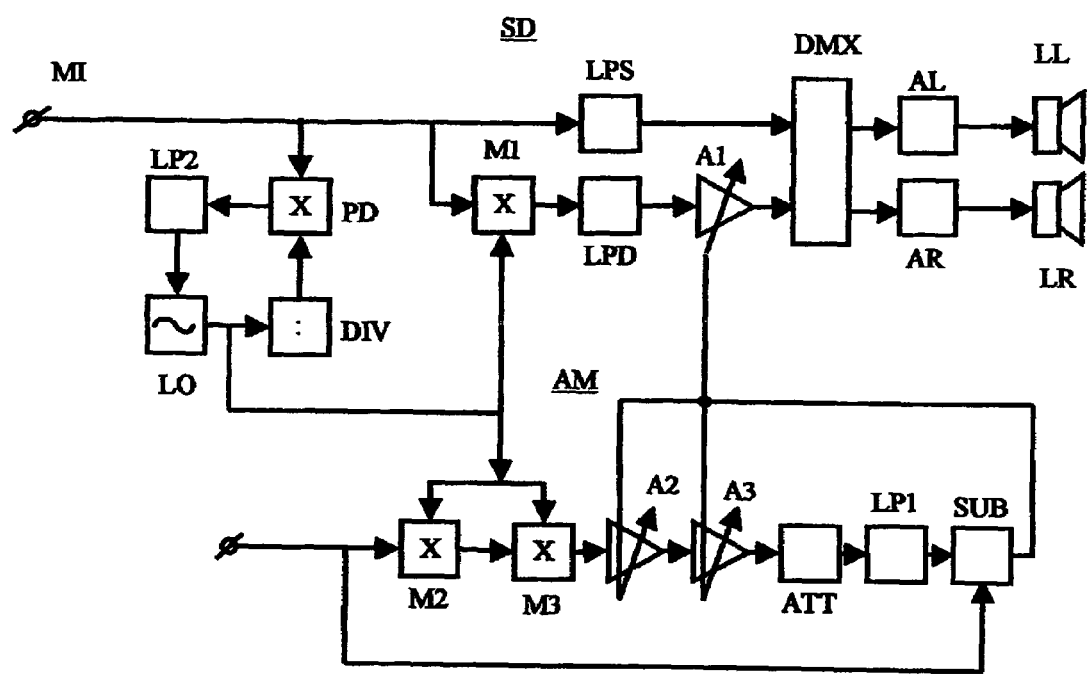
FIG. 2 shows a second embodiment of an arrangement for decoding a stereo multiplex signal according to the invention.

FIG. 2 shows a second embodiment of an arrangement for decoding a stereo multiplex signal according to the invention, which differs from the above first embodiment in that the gain of the first to third mixer stages M1 to M3 is varied by using gain controlled amplifiers following the output of those mixer stages instead of varying the amplitude of the local sinusoidal 38 kHz subcarrier. In the embodiment shown in this FIG. 2, a first gain controlled amplifier A1 is being included in the stereo difference signal path between the low pass filter LPD and the second input DI of the dematrix circuit DMX and second and third gain controlled amplifiers A2 and A3 respectively, are being included in the automatic gain control loop between the third mixer stage M3 and the 6 dB attenuator ATT. Gain control inputs of these first to third gain controlled amplifiers A1 to A3 are provided with an automatic gain control signal from the difference circuit SUB. For an application of the invention, the exact location of these first to third gain controlled amplifiers A1 to A3 is not relevant, they may be placed anywhere in the signal path of said first to third mixer stages M1–M3, either preceding the signal or carrier input, or following the output thereof. Alternatively, the second and third gain controlled amplifiers A2 and A3 may be substituted by a single quadrating gain controlled amplifier (not shown) providing a second order varying gain factor.

To synchronise the local sinusoidal 38 kHz subcarrier in phase with the incoming 19 kHz pilot signal of the stereo multiplex signal, this pilot signal is supplied from the input SDI of the stereo decoder SD to phase detector PD included in a phase locked loop, in which the phase detector PD is coupled through a loop filter LP2 to a control input of the local oscillator LO, an output of this local oscillator LO being coupled to the carrier inputs of the first to third mixer stages M1 to M3, as well as to an input of a frequency divider DIV dividing the 38 kHz frequency of the local subcarrier by two into 19 kHz, which is compared in the phase detector PD with the incoming 19 kHz pilot signal. The function of the phase locked loop is on itself known and need no further amplification for an understanding of the invention.

Alternatively, the local sinusoidal 38 kHz subcarrier can also be derived from the 19 kHz pilotsignal by filtering and frequency doubling.

In principle the reference signal Vref could have any type of signal form. Instead of using a DC voltage level, also AC signals having sinusoidal or other waveforms are suitable to be used as reference signal.

The scope of the invention is not limited to the embodiments explicitly disclosed. The invention is embodied in each new characteristic and each combination of characteristics. Any reference signs do not limit the scope of the claims. The word "comprising" does not exclude the presence of other elements than those listed in a claim. Use of the word "a" or "an" preceding an element does not exclude the presence of a plurality of such elements.

The invention claimed is:

1. An arrangement for decoding a stereo multiplex signal, comprising:
   a baseband sum signal (L+R),
   a difference signal (L−R) which is amplitude-modulated on a suppressed sub-carrier and
   a pilot signal having a frequency located between the frequency bands of the sum and difference signals,
   a dematrix circuit
   an input for the stereo multiplex signal coupled through parallel stereo sum and difference signal paths to first and second inputs of the dematrix circuit,
   a synchronous demodulator being included in the difference signal path,
   a local sinusoidal sub-carrier being supplied to a carrier input of the synchronous demodulator for a synchronous demodulation of the amplitude-modulated difference signal (L−R) into baseband,
   an automatic gain control loop comprising
      a first mixer stage that is configured to receive a reference signal,
      a second mixer stage that is configured to receive a signal output of the first mixer stage,
      the first and second mixer stages having carrier inputs being supplied with the local sinusoidal sub-carrier for a respective up and down conversion of the reference signal,
      a difference circuit, operably coupled to the second mixer stage via an attenuator, that is configured to provide a difference between an output signal of the attenuator and the reference signal,
      a gain controlled amplifier stage,
      the difference circuit being coupled to a control input of the first gain controlled amplifier stage for varying a gain of the synchronous demodulator and the first and second mixer stages.

2. An arrangement according to claim 1, characterized in that
   the gain controlled amplifier stage comprises
      a gain controlled sub-carrier amplifier for varying an amplitude of the local sinusoidal sub-carrier prior to the supply thereof to the carrier inputs of the synchronous demodulator and the first and second mixer stages.

3. An arrangement according to claim 1, characterized in that
   the gain controlled amplifier comprises
      first, second, and third gain controlled amplifiers,
         each of the first, second, and third gain controlled amplifiers having a control input in common with the control input of the gain controlled amplifier stage,
   the first gain controlled amplifier being included in the difference signal path, and
   the second and third gain controlled amplifiers being included in the automatic gain control loop.

4. An arrangement as claimed in claim 1, wherein
   the reference signal corresponds to a DC level voltage.

5. An arrangement as claimed in claim 1, wherein
   the attenuator comprises a resistive voltage divider comprising two serially connected mutually equal resistors.

6. An arrangement as claimed in claim 1, further including
   a phase locked loop that includes
      a voltage controlled oscillator that is configured to supply the local sinusoidal sub-carrier,
      a phase detector that is configured to receive the pilot signal and to control the voltage controlled oscillator for a phase synchronisation of the local sinusoidal sub-carrier phase with the pilot signal.

7. An arrangement as claimed in claim 2, wherein
   the reference signal corresponds to a DC level voltage.

8. An arrangement as claimed in claim 3, wherein the reference signal corresponds to a DC level voltage.

9. An arrangement as claimed in claim 2, wherein the attenuator comprises a resistive voltage divider comprising two serially connected mutually equal resistors.

10. An arrangement as claimed in claim 3, wherein the attenuator comprises a resistive voltage divider comprising two serially connected mutually equal resistors.

11. An arrangement as claimed in claim 2, further including
a phase locked loop that includes
a voltage controlled oscillator that is configured to supply the local sinusoidal sub-carrier,
a phase detector that is configured to receive the pilot signal and to control the voltage controlled oscillator for a phase synchronisation of the local sinusoidal sub-carrier phase with the pilot signal.

12. An arrangement as claimed in claim 3, further including
a phase locked loop that includes
a voltage controlled oscillator that is configured to supply the local sinusoidal sub-carrier,
a phase detector that is configured to receive the pilot signal and to control the voltage controlled oscillator for a phase synchronisation of the local sinusoidal sub-carrier phase with the pilot signal.

13. An arrangement as claimed in claim 9, further including
a phase locked loop that includes
a voltage controlled oscillator that is configured to supply the local sinusoidal sub-carrier,
a phase detector that is configured to receive the pilot signal and to control the voltage controlled oscillator for a phase synchronisation of the local sinusoidal sub-carrier phase with the pilot signal.

14. An arrangement as claimed in claim 10, further including
a phase locked loop that includes
a voltage controlled oscillator that is configured to supply the local sinusoidal sub-carrier,
a phase detector that is configured to receive the pilot signal and to control the voltage controlled oscillator for a phase synchronisation of the local sinusoidal sub-carrier phase with the pilot signal.

15. An FM radio receiver comprising
an arrangement for decoding a stereo multiplex signal that includes:
a baseband sum signal (L+R),
a difference signal (L−R) which is amplitude-modulated on a suppressed sub-carrier and
a pilot signal having a frequency located between the frequency bands of the sum and difference signals,
a dematrix circuit
an input for the stereo multiplex signal coupled through parallel stereo sum and difference signal paths to first and second inputs of the dematrix circuit,
a synchronous demodulator being included in the difference signal path,
a local sinusoidal sub-carrier being supplied to a carrier input of the synchronous demodulator for a synchronous demodulation of the amplitude-modulated difference signal (L−R) into baseband,
an automatic gain control loop comprising
a first mixer stage that is configured to receive a reference signal,
a second mixer stage that is configured to receive a signal output of the first mixer stage,
the first and second mixer stages having carrier inputs being supplied with the local sinusoidal sub-carrier for a respective up and down conversion of the reference signal,
a difference circuit, operably coupled to the second mixer stage via an attenuator, that is configured to provide a difference between an output signal of the attenuator and the reference signal,
a gain controlled amplifier stage,
the difference circuit being coupled to a control input of the first gain controlled amplifier stage for varying a gain of the synchronous demodulator and the first and second mixer stages.

16. An FM receiver as claimed in claim 15, wherein the gain controlled amplifier stage comprises
a gain controlled sub-carrier amplifier for varying an amplitude of the local sinusoidal sub-carrier prior to the supply thereof to the carrier inputs of the synchronous demodulator and the first and second mixer stages.

17. An FM receiver as claimed in claim 15, wherein the gain controlled amplifier comprises
first, second, and third gain controlled amplifiers,
each of the first, second, and third gain controlled amplifiers having a control input in common with the control input of the gain controlled amplifier stage,
the first gain controlled amplifier being included in the difference signal path, and
the second and third gain controlled amplifiers being included in the automatic gain control loop.

18. An FM receiver as claimed in claim 15, wherein the reference signal corresponds to a DC level voltage.

19. An FM receiver as claimed in claim 15, wherein the attenuator comprises a resistive voltage divider comprising two serially connected mutually equal resistors.

20. An FM receiver as claimed in claim 15, further including
a phase locked loop that includes
a voltage controlled oscillator that is configured to supply the local sinusoidal sub-carrier,
a phase detector that is configured to receive the pilot signal and to control the voltage controlled oscillator for a phase synchronisation of the local sinusoidal sub-carrier phase with the pilot signal.

* * * * *